United States Patent
Do et al.

(10) Patent No.: US 12,400,965 B2
(45) Date of Patent: Aug. 26, 2025

(54) POWER MODULE

(71) Applicants: Hyundai Motor Company, Seoul (KR); Kia Corporation, Seoul (KR)

(72) Inventors: Han Jin Do, Incheon (KR); Jin Myeong Yang, Seongnam-si (KR); Sung Won Park, Icheon (KR)

(73) Assignees: Hyundai Motor Company, Seoul (KR); Kia Corporation, Seoul (KR)

(*) Notice: Subject to any disclaimer, the term of this patent is extended or adjusted under 35 U.S.C. 154(b) by 389 days.

(21) Appl. No.: 18/134,933

(22) Filed: Apr. 14, 2023

(65) Prior Publication Data

US 2024/0178147 A1 May 30, 2024

(30) Foreign Application Priority Data

Nov. 29, 2022 (KR) .................. 10-2022-0162849

(51) Int. Cl.
*H01L 23/538* (2006.01)
*H01L 23/498* (2006.01)
*H01L 25/07* (2006.01)

(52) U.S. Cl.
CPC .... *H01L 23/5385* (2013.01); *H01L 23/49811* (2013.01); *H01L 25/072* (2013.01)

(58) Field of Classification Search
CPC ........... H01L 23/5385; H01L 23/49811; H01L 25/072; H01L 23/5386
See application file for complete search history.

(56) References Cited

U.S. PATENT DOCUMENTS

| | | | |
|---|---|---|---|
| 7,145,254 B2 * | 12/2006 | Hirano | H01L 24/33 257/796 |
| 7,569,920 B2 * | 8/2009 | Otremba | H01L 23/481 257/E23.071 |
| 9,041,183 B2 * | 5/2015 | Liang | H01L 23/3735 257/691 |
| 9,275,926 B2 * | 3/2016 | Hable | H01L 23/4334 |
| 9,922,911 B1 * | 3/2018 | Park | H01L 23/49562 |
| 10,032,689 B2 * | 7/2018 | Jeon | H01L 24/33 |
| 11,121,055 B2 * | 9/2021 | Cheng | H01L 21/565 |
| 11,343,943 B1 * | 5/2022 | Salvatore | H05K 7/14322 |
| 11,532,557 B2 * | 12/2022 | Wang | H01L 23/5385 |
| 11,721,613 B2 * | 8/2023 | Kim | H01L 23/047 257/676 |

(Continued)

FOREIGN PATENT DOCUMENTS

| | | | | |
|---|---|---|---|---|
| AU | 2023350079 A1 * | 4/2025 | ............ | H01L 25/16 |
| CN | 104217966 A * | 12/2014 | ......... | H01L 23/3107 |

(Continued)

*Primary Examiner* — Laura M Menz
(74) *Attorney, Agent, or Firm* — Morgan, Lewis & Bockius LLP

(57) ABSTRACT

A power module includes an upper substrate, a lower substrate, a first semiconductor chip, a first spacer configured to electrically connect a first metal layer to a second metal layer, a second spacer configured to electrically connect the first semiconductor chip to the first metal layer, a first connection layer having conductivity, disposed between the upper substrate and the lower substrate, and configured to allow the first spacer and the second spacer to penetrate the first connection layer, and a power lead.

20 Claims, 6 Drawing Sheets

(56) References Cited

U.S. PATENT DOCUMENTS

| | | | | |
|---|---|---|---|---|
| 11,728,239 B2* | 8/2023 | Kim | | H01L 23/373 |
| | | | | 257/706 |
| 11,756,915 B2* | 9/2023 | Kim | | H01L 23/3735 |
| | | | | 257/777 |
| 11,830,784 B2* | 11/2023 | Cheng | | H01L 23/4334 |
| 12,027,439 B2* | 7/2024 | Kim | | H01L 23/495 |
| 12,028,006 B2* | 7/2024 | You | | H02M 7/48 |
| 12,183,654 B2* | 12/2024 | Kim | | H01L 23/4334 |
| 12,278,158 B2* | 4/2025 | Cheng | | H01L 23/049 |
| 12,289,873 B2* | 4/2025 | You | | H02M 7/003 |
| 2004/0195649 A1 | 10/2004 | Miura | | H01L 25/072 |
| | | | | 257/E23.092 |
| 2008/0054425 A1* | 3/2008 | Malhan | | H01L 24/01 |
| | | | | 257/E25.016 |
| 2009/0116197 A1* | 5/2009 | Funakoshi | | H01L 21/4882 |
| | | | | 438/122 |
| 2009/0321924 A1* | 12/2009 | Funakoshi | | H01L 23/4735 |
| | | | | 257/722 |
| 2013/0020694 A1* | 1/2013 | Liang | | H01L 23/473 |
| | | | | 257/691 |
| 2014/0159216 A1* | 6/2014 | Ishino | | H01L 23/3114 |
| | | | | 438/122 |
| 2016/0005676 A1* | 1/2016 | Orimoto | | H01L 23/3736 |
| | | | | 257/714 |
| 2016/0126157 A1* | 5/2016 | Jeon | | H01L 23/051 |
| | | | | 257/693 |
| 2017/0338168 A1* | 11/2017 | Park | | H01L 24/41 |
| 2018/0082921 A1* | 3/2018 | Grassmann | | H01L 23/49575 |
| 2018/0102301 A1* | 4/2018 | Jeon | | H01L 25/50 |
| 2019/0051586 A1* | 2/2019 | Park | | H01L 24/33 |
| 2019/0326195 A1* | 10/2019 | Han | | H01L 21/565 |
| 2019/0360768 A1* | 11/2019 | Dahlberg | | F28F 3/044 |
| 2020/0029455 A1* | 1/2020 | Hong | | H05K 1/0296 |
| 2020/0111721 A1* | 4/2020 | Park | | H01L 24/33 |
| 2020/0126925 A1* | 4/2020 | Michiaki | | H01L 23/5386 |
| 2020/0258824 A1* | 8/2020 | Maldo | | H01L 23/3735 |
| 2021/0202386 A1* | 7/2021 | Wang | | H01L 23/5385 |
| 2021/0217679 A1* | 7/2021 | Cheng | | H01L 24/32 |
| 2021/0327842 A1* | 10/2021 | Kim | | H01L 24/83 |
| 2021/0398874 A1* | 12/2021 | Cheng | | H01L 23/4334 |
| 2022/0068769 A1* | 3/2022 | Kim | | H01L 23/498 |
| 2022/0115291 A1* | 4/2022 | Kim | | H01L 23/4334 |
| 2023/0187403 A1* | 6/2023 | Hong | | H01L 24/32 |
| | | | | 257/773 |
| 2023/0197557 A1* | 6/2023 | Kim | | H01L 23/3735 |
| | | | | 257/678 |
| 2023/0352364 A1* | 11/2023 | Kim | | H01L 23/645 |
| 2023/0397336 A1* | 12/2023 | Kong | | H01L 23/3735 |
| 2023/0412106 A1* | 12/2023 | You | | H02M 7/48 |
| 2024/0071858 A1* | 2/2024 | Kim | | H01L 23/3735 |
| 2024/0088009 A1* | 3/2024 | Park | | H01L 24/83 |
| 2024/0096734 A1* | 3/2024 | Cheng | | H01L 21/52 |
| 2024/0105573 A1* | 3/2024 | Park | | H01L 24/83 |
| 2024/0106336 A1* | 3/2024 | Do | | H02M 7/003 |
| 2024/0136296 A1* | 4/2024 | Hwang | | H01L 23/5385 |
| 2024/0178147 A1* | 5/2024 | Do | | H01L 23/49811 |
| 2024/0297123 A1* | 9/2024 | Zhou | | H01L 25/072 |
| 2024/0353446 A1* | 10/2024 | Kim | | H01C 1/08 |
| 2024/0421106 A1* | 12/2024 | Yang | | H01L 23/49844 |
| 2025/0079407 A1* | 3/2025 | Ewald | | H01L 25/18 |

FOREIGN PATENT DOCUMENTS

| | | | | |
|---|---|---|---|---|
| CN | 107919349 A | * | 4/2018 | ......... H01L 23/3675 |
| CN | 108231709 A | * | 6/2018 | ........... H01L 25/072 |
| CN | 113113391 A | * | 7/2021 | ............. H01L 23/3735 |
| CN | 115985864 A | * | 4/2023 | ......... H01L 23/3735 |
| CN | 116266576 A | * | 6/2023 | ........... H01L 23/293 |
| CN | 118116905 A | * | 5/2024 | ......... H01L 23/5385 |
| DE | 102015219852 A1 | * | 5/2016 | ............. H01L 21/52 |
| DE | 102017203846 A1 | * | 4/2018 | ........... H01L 23/3735 |
| DE | 102018219377 A1 | * | 10/2019 | ............. H01L 24/81 |
| DE | 102020000169 A1 | * | 8/2020 | ....... H01L 23/49503 |
| DE | 102020007677 A1 | * | 7/2021 | ............. H01L 24/83 |
| DE | 102021119469 A1 | * | 3/2022 | ............. H01L 23/16 |
| DE | 112019007709 T5 | * | 5/2022 | ........... H01L 25/072 |
| DE | 102022133168 A1 | * | 6/2023 | ............. H01L 24/24 |
| DE | 102023114094 A1 | * | 3/2024 | ....... H01L 23/49833 |
| DE | 102023110306 A1 | * | 5/2024 | ......... H01L 23/5385 |
| DE | 102023211998 A1 | * | 12/2024 | ............. G01R 19/0092 |
| EP | 3598489 A1 | * | 1/2020 | ............. H01L 23/49 |
| JP | 6374240 | | 8/2018 | |
| KR | 101755769 B1 | * | 7/2017 | ......... H01L 23/5385 |
| KR | 20180038597 A | * | 4/2018 | ......... H01L 23/3675 |
| KR | 20220017739 A | * | 2/2022 | ......... H01L 23/5383 |
| KR | 10-2022-0109171 | | 8/2022 | |
| KR | 20240025392 A | * | 2/2024 | ........... H01L 23/367 |
| KR | 20240036981 A | * | 3/2024 | ......... H01L 21/4875 |
| KR | 20240079698 A | * | 6/2024 | ......... H01L 23/5385 |
| KR | 20240114018 A | * | 7/2024 | ........... H01L 21/565 |
| WO | WO-2020105476 A1 | * | 5/2020 | ............. H01L 24/40 |
| WO | WO2022-162871 A1 | | 8/2022 | |
| WO | WO-2023083338 A1 | * | 5/2023 | ........... H01L 25/072 |

* cited by examiner

POWER MODULE

CROSS-REFERENCE TO RELATED APPLICATION

The present application claims priority to Korean Patent Application No. 10-2022-0162849, filed on Nov. 29, 2022, the entire contents of which is incorporated herein for all purposes by this reference.

BACKGROUND OF THE PRESENT DISCLOSURE

Field of the Present Disclosure

The present disclosure relates to a power module, and more particularly, to a power module in which a connection layer is additionally disposed between an upper substrate and a lower substrate to improve operating efficiency.

DESCRIPTION OF RELATED ART

These days, with growing interest in the environment, the number of eco-friendly vehicles having electric motors as power sources is increasing. The eco-friendly vehicles may also be referred to as electrified vehicles, and as representative examples, there are electric vehicles (EVs) and hybrid electric vehicles (HEVs).

Such an electrified vehicle has an inverter configured to convert DC power into AC power at the time of driving a motor, and the inverter generally includes one or a plurality of power modules having semiconductor chips, which perform a switching function.

In a process of operating the power module, as high-voltage large current flows, heating of the semiconductor chips in the power module occurs. To stably operate the power module, it is necessary to solve heating of the semiconductor chips, and for the present purpose, various methods may be employed.

Power modules include a single side cooling-type power module in which heat generated from semiconductor chips is transmitted to one substrate to cool the power module, and a double side cooling-type power module in which heat generated from semiconductor chips is dispersively transmitted to an upper substrate and a lower substrate to cool the power module, depending on the kind of a cooling method.

In the double side cooling-type power module, the size and electrical characteristics of the power module have a great effect on the reliability of the power module, and the smaller the size of the power module and the better the electrical characteristics of the power module, the better the reliability of the power module.

As an output requirement specifications of the inverter are gradually raised, the amount of heat generated from semiconductor chips is also increased to support high output, and to cope with the increased amount of heat, the sizes of major elements, such as the semiconductor chips, substrates, etc., are increased.

As the size of the power module is increased, a current loop is elongated and becomes complicated, and may thus cause reliability problems, such as deterioration of the electrical characteristics of the power module, warpage of the substrates, etc., and therefore, measures to solve these problems need to be suggested.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a power module in which a connection layer is additionally disposed between an upper substrate and a lower substrate to simplify a current loop and to improve a current superposition effect.

In accordance with an aspect of the present disclosure, the above and other objects may be accomplished by the provision of a power module including an upper substrate including a first insulating layer and a first metal layer disposed on a lower surface of the first insulating layer, a lower substrate disposed below the upper substrate and including a second insulating layer and a second metal layer disposed on an upper surface of the second insulating layer to face the first metal layer, a first semiconductor chip disposed on the second metal layer, a first spacer extending in a vertical direction of the power module and electrically connecting the first metal layer to the second metal layer, a second spacer extending in the vertical direction and electrically connecting the first semiconductor chip to the first metal layer, a first connection layer having conductivity and disposed between the upper substrate and the lower substrate to traverse a middle portion of each of the first spacer and the second spacer, and a power lead disposed on the second metal layer.

The first connection layer may allow at least one of the first spacer or the second spacer to penetrate the first connection layer.

At least one of a first through hole having a planar area corresponding to a planar area of the first spacer and to allow the first spacer to penetrate the first connection layer, or a second through hole having a planar area corresponding to a planar area of the second spacer and to allow the second spacer to penetrate the first connection layer may be provided in the first connection layer.

At least one of the first spacer or the second spacer may be separated into an upper portion and a lower portion, and the first connection layer may be disposed between the upper portion and the lower portion of the at least one of the first spacer or the second spacer to connect the upper portion and the lower portion.

The first connection layer may form electrical connection relations through a pattern formed on a plane.

The pattern may be formed through a combination of a plurality of separated panels disposed abreast to be spaced from one another in a horizontal direction thereof.

A thickness of the first connection layer may be equal to or greater than a thickness of the power lead.

The first connection layer may include a substrate corresponding portion configured so that at least a portion thereof overlaps the upper substrate and the lower substrate on a plane, and a lead corresponding portion having a width less than a width of the substrate corresponding portion and to extend from the substrate corresponding portion to protrude outside the upper substrate and the lower substrate on the plane, and provided so that current is input to the lead corresponding portion or is output from the lead corresponding portion.

The lead corresponding portion may correspond to any one of a positive terminal, a negative terminal, and an output terminal, and the power lead may correspond to another one of the positive terminal, the negative terminal, and the output terminal.

The power module may further include a second connection layer disposed between the upper substrate and the lower substrate to be spaced from the first connection layer in the vertical direction, and the second connection layer may correspond to a remaining one of the positive terminal, the negative terminal, and the output terminal.

The lead corresponding portion may be disposed to be spaced upwards apart from the power lead to overlap the power lead on the plane.

The lead corresponding portion may be bent downwards from the substrate corresponding portion and may extend outside the upper substrate and the lower substrate to be spaced from the power lead in a horizontal direction at the same height and disposed abreast to the power lead.

The substrate corresponding portion may be disposed parallel to the upper substrate and the lower substrate to be spaced from the upper substrate and the lower substrate in the vertical direction.

The power module may further include a third spacer spaced from the second spacer in a horizontal direction with the first spacer provided therebetween, and the substrate corresponding portion may be bent upwards or downwards between the first spacer and the third spacer, and may be bonded to the upper substrate or the lower substrate.

The power module may further include a third spacer spaced from the second spacer in a horizontal direction with the first spacer provided therebetween, and the first connection layer may allow the third spacer to penetrate the first connection layer.

The power module may further include a third spacer spaced from the second spacer in a horizontal direction with the first spacer provided therebetween, and the first connection layer may be bonded to a side surface of the third spacer.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

BRIEF DESCRIPTION OF THE DRAWINGS

The above and other objects, features and other advantages of the present disclosure

Figure 1:
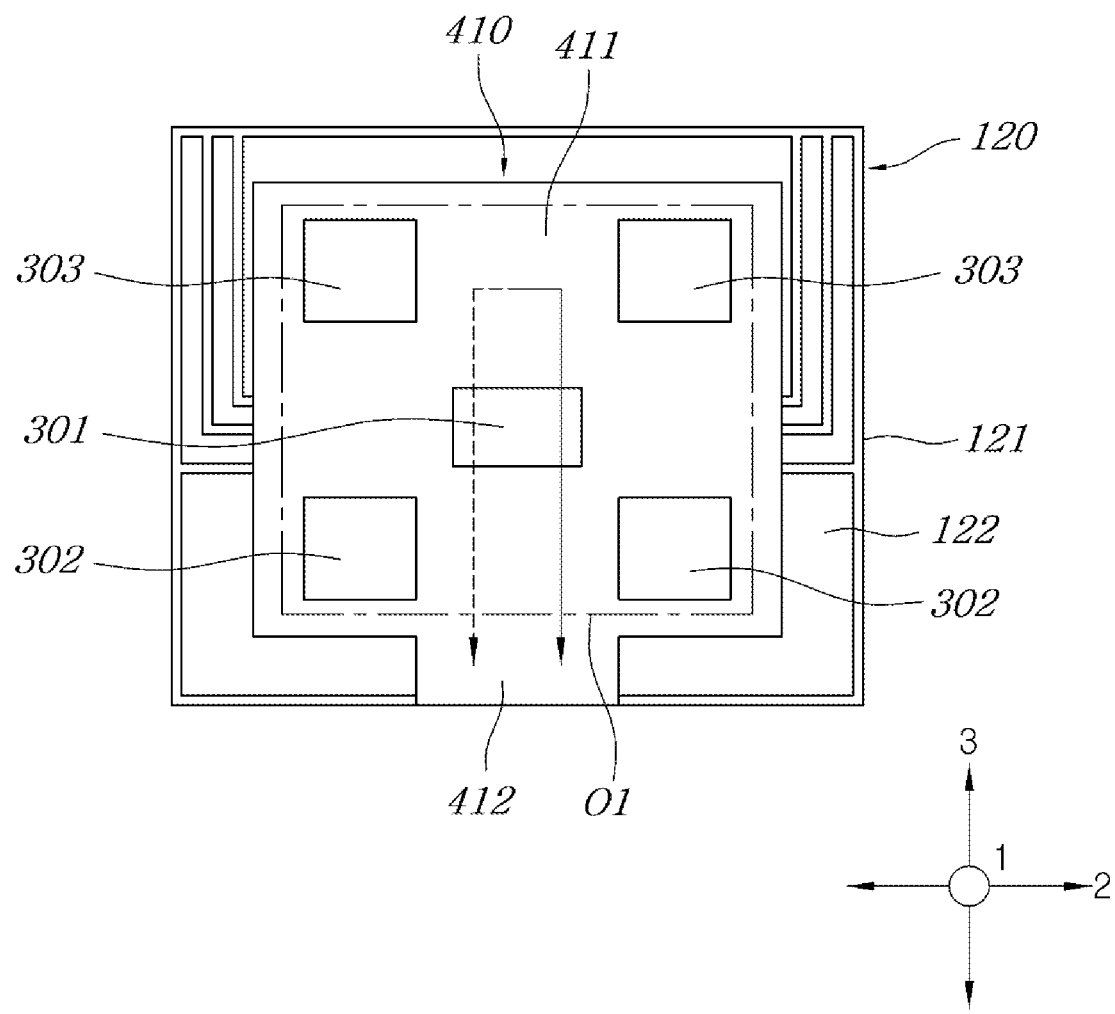
FIG. 1 is a plan view of a portion of a power module according to an exemplary embodiment of the present disclosure, viewed in the direction of a first axis.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Specific structural or functional descriptions in embodiments of the present disclosure set forth in the description which follows will be exemplarily provided to describe the exemplary embodiments of the present disclosure. However, the present disclosure may be embodied in many alternative forms, and should not be construed as being limited to the exemplary embodiments set forth herein.

The exemplary embodiments of the present disclosure may be variously modified and changed, and thus specific embodiments of the present disclosure will be illustrated in the drawings and described in detail in the following description of the exemplary embodiments of the present disclosure. However, it will be understood that the exemplary embodiments of the present disclosure are provided only to completely include the present disclosure and cover modifications, equivalents or alternatives which come within the scope and technical range of the present disclosure.

Unless defined otherwise, all terms including technical and scientific terms used in the following description have the same meanings as those of terms generally understood by those skilled in the art. Terms defined in generally used dictionaries will be interpreted as having meanings coinciding with contextual meanings in the related technology, and are not to be interpreted as having ideal or excessively formal meanings unless defined clearly in the description.

Hereinafter, reference will now be made in detail to exemplary embodiments of the present disclosure, examples of which are illustrated in the accompanying drawings. Wherever possible, the same reference numbers will be used throughout the drawings to refer to the same or like parts.

In the following description of the embodiments, suffixes, such as "module", "part" and "unit", are provided or used interchangeably merely in consideration of ease in statement of the specification, and do not have meanings or functions distinguished from one another.

In the following description of the exemplary embodiments of the present disclosure, a detailed description of known functions and configurations incorporated herein will be omitted when it may make the subject matter of the present disclosure rather unclear. Furthermore, the accompanying drawings will be exemplarily provided to describe the exemplary embodiments of the present disclosure, and should not be construed as being limited to the exemplary embodiments set forth herein, and it will be understood that the exemplary embodiments of the present disclosure are provided only to completely include the present disclosure and cover modifications, equivalents or alternatives which come within the scope and technical range of the present disclosure.

In the following description of the embodiments, terms, such as "first" and "second", are used only to describe various elements, and these elements should not be construed as being limited by these terms. These terms are used only to distinguish one element from other elements.

When an element or layer is referred to as being "connected to" or "coupled to" another element or layer, it may be directly connected or coupled to the other element or layer, or intervening elements or layers may be present. In contrast, when an element or layer is referred to as being "directly connected to" or "directly coupled to" another element or layer, there may be no intervening elements or layers present.

As used herein, singular forms may be intended to include plural forms as well, unless the context clearly indicates otherwise.

In the following description of the embodiments, the terms "comprises," "comprising," "including," and "having" are inclusive and therefore specify the presence of stated features, integers, steps, operations, elements, components, and/or combinations thereof, but do not preclude the presence or addition of one or more other features, integers, steps, operations, elements, components, and/or combinations thereof.

An exemplary embodiment of the present disclosure suggests simplification of a current loop and increase in a degree of current superposition through the structure of a power module including a first connection layer 410 disposed between an upper substrate 110 and a lower substrate 120 and penetrated by a plurality of spacers 300.

Herein, the current loop may be defined as a path in which current input from the outside thereof passes through respective elements in the power module and is then output to the outside.

Furthermore, as the degree of current superposition may be increased as the current loop narrows, the operating efficiency of the power module may be improved due to mutual induction as the degree of current superposition is increased.

Hereinafter, the configuration and structure of the power module including improved operating efficiency according to an exemplary embodiment of the present disclosure will be descried with reference to FIG. 1 and FIG. 2.

Figure 2:
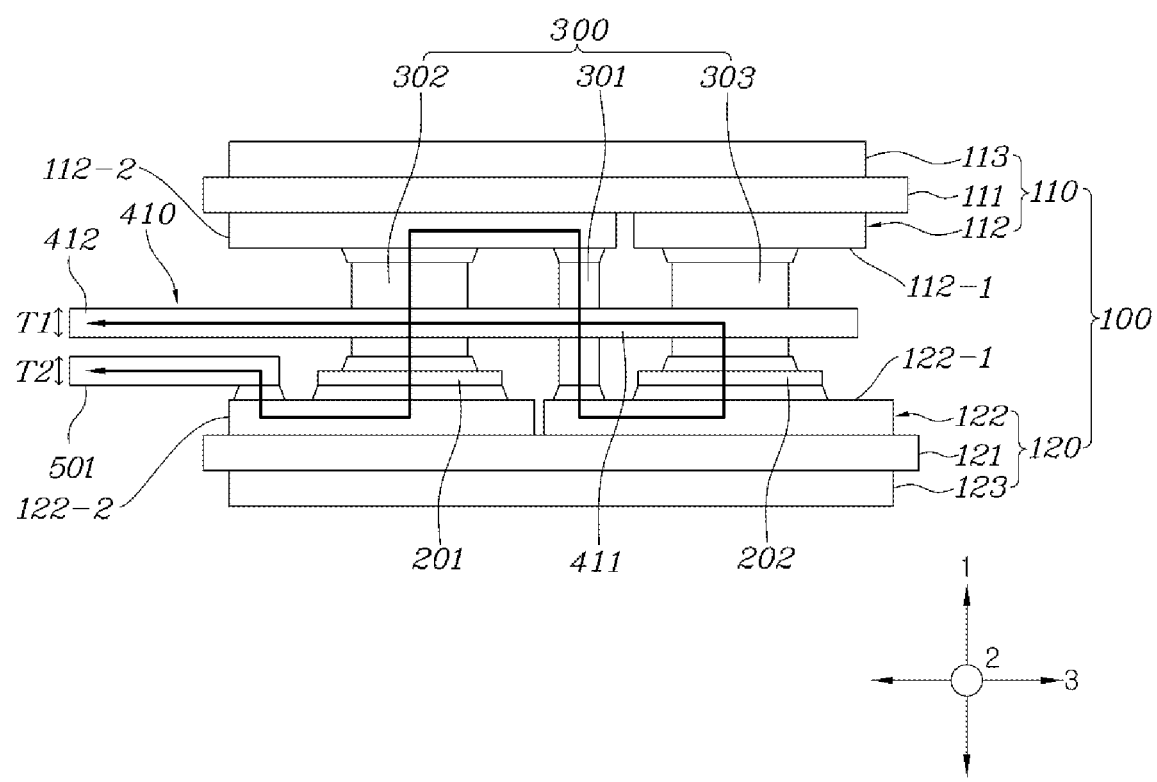
FIG. 2 is a side view of the power module according to an exemplary embodiment of the present disclosure, viewed in the direction of a second axis.

FIG. 1 is a plan view of a part of the power module according to an exemplary embodiment of the present disclosure, viewed in the direction of a first axis, and FIG. 2 is a side view of the power module according to an exemplary embodiment of the present disclosure, viewed in the direction of a second axis.

More concretely, FIG. 1 is a plan view of a part of the power module according to an exemplary embodiment of the present disclosure other than the upper substrate 110, viewed down from above in the direction of the first axis, and FIG. 2 is a side view of the power module according to an exemplary embodiment of the present disclosure, viewed from the right in the direction of the second axis, in the state in which the upper substrate 110 is added to the part of the power module shown in FIG. 1.

Referring to FIG. 1 and FIG. 2, the power module according to various exemplary embodiments of the present disclosure may include the upper substrate 110, the lower substrate 120, first semiconductor chips 201, second semiconductor chips 202, first, second, and third spacers 300, the first connection layer 410, and a power lead 501.

FIG. 1 and FIG. 2 mainly illustrate elements related to the present disclosure, and the power module may substantially include a larger or smaller number of elements.

Hereinafter, the respective elements of the power module and the structure of the power module will be described.

First, referring to FIG. 2, the upper substrate 110 includes a first insulating layer 111, and a first metal layer 112 disposed on the lower surface of the first insulating layer 111.

The lower substrate 120 may be disposed below the upper substrate 110 in the direction of the first axis to be spaced from the upper substrate 110, and includes a second insulating layer 121, and a second metal layer 122 disposed on the upper surface of the second insulating layer 121 to face the first metal layer 112.

Furthermore, a third metal layer 113 may be disposed on the upper surface of the first insulating layer 111 of the upper substrate 110, and a fourth metal layer 123 may be disposed on the lower surface of the first lower surface 121 of the lower substrate 120.

The first insulating layer 111 and the second insulating layer 121 may electrically isolate the inside and the outside of the power module from each other, and may receive heat, generated from the semiconductor chips 201 and 202, from the first metal layer 112 and the second metal layer 122 disposed inside the power module. Furthermore, when the third metal layer 113 and the fourth metal layer 123 are disposed, the first insulating layer 111 and the second insulating layer 121 may transmit the heat, received from the first metal layer 112 and the second metal layer 122, to the third metal layer 113 and the fourth metal layer 123.

The first metal layer 112 and the second metal layer 122 may be disposed inside the power module opposite to each other, and may form electrical connection relations between the first semiconductor chips 201 and the second semiconductor chips 202 through a pattern.

On the other hand, the third metal layer 113 and the fourth metal layer 123 is configured to emit the received heat to the outside and to cool the power module through heat exchange with the outside thereof, and may thus reduce the operating temperature of the power module so that the power module may be stably operated.

Furthermore, to improve cooling performance of the power module, a cooling channel may be additionally provided outside the third metal layer 113 or the fourth metal layer 123. The cooling channel may employ, for example, an air cooling-type cooling channel or a water cooling-type cooling channel, and may improve cooling efficiency through a refrigerant to improve the cooling performance of the power module.

The first to fourth metal layers 112, 113, 122 and 123 may be formed of, for example, copper (Cu), and the first insulating layer 111 and the second insulating layer 121 may be formed of ceramic. In the instant case, the upper substrate 110 and the lower substrate 120 may be implemented as active metal brazed (AMB) substrates or direct bonded copper (DBC) substrates.

The first semiconductor chips 201 may be disposed on the second metal layer 122, and the second semiconductor chips 202 may be disposed on the second metal layer 122 to be spaced from the first semiconductor chips 201 in the direction of a third axis. However, the disposition of the first semiconductor chips 201 and the second semiconductor chips 202 is not limited thereto, and for example, the second semiconductor chips 202 in a flipped state may be disposed on the first metal layer 112 to be spaced from the first semiconductor chips 201.

The first semiconductor chips 201 and the second semiconductor chips 202 may be turned on/off depending on switching signals, and accordingly, whether or not the upper and lower portions of each of the first semiconductor chips 201 and the second semiconductor chips 202 are electrically connected may be determined.

Here, the switching signals may be input in a form of voltage through signal pads provided on the first semiconductor chips 201 and the second semiconductor chips 202, and when the switching signals are input, the upper and lower portions of each of the first semiconductor chips 201 and the second semiconductor chips 202 are electrically connected, and thus, current may flow to power pads provided together with the switching pads.

The first semiconductor chips 201 and the second semiconductor chips 202 may be switching elements, for example, insulated gate bipolar transistors (IGBTs) or metal-oxide-semiconductor field-effect transistors (MOSFETs).

Furthermore, the semiconductor chips 200 may be formed of a material, such as silicon (Si) or silicon carbide (SiC).

In an exemplary embodiment of the present disclosure, the first metal layer 112 may include a right first metal layer 112-1 and a left first metal layer 112-2 and the second metal layer 122 may include a right second metal layer 122-1 and a left second metal layer 122-2.

The first spacer 301 extends in the vertical direction (i.e., in the direction of the first axis), and electrically connects the first metal layer 112 to the second metal layer 122 so that current may flow vertically in the direction of the first axis. Furthermore, the first spacer 301 may be referred to as a "via spacer".

The second spacers 302 extend in the vertical direction (i.e., in the direction of the first axis), electrically connect the first semiconductor chips 201 to the first metal layer 112, and may be disposed on the power pads of the first semiconductor chips 201 and may have a planar area determined in consideration of heat transfer efficiency. In the same manner as the first spacer 301, the second spacers 302 allow current to flow vertically in the direction of the first axis.

Furthermore, the power module according to various exemplary embodiments of the present disclosure may include third spacers 303 spaced from the second spacers 302 in the horizontal direction (in the direction of the third axis) with the first spacer 301 provided therebetween. The second spacers 302 and the third spacers 303 may be referred to as "chip spacers".

The first spacer 301, the second spacers 302 and the third spacers 303 may be formed of a conductive material to electrically interconnect the first metal layer 112, the second metal layer 122, the first semiconductor chips 201, etc.

The first connection layer 410 has conductivity, is disposed between the upper substrate 110 and the lower substrate 120, and concretely, is disposed to traverse the middle portions of the first spacer 301 and the second spacers 302.

In the instant case, the first connection layer 410 allows at least one of the first spacer 301 or the second spacers 302 to penetrate the first connection layer 410, to be disposed to traverse the first spacer 301 and the second spacers 302. That is, the first spacer 301 and the second spacers 302 may penetrate the first connection layer 410 in the direction of the first axis.

At least one through hole 413 may be formed through the first connection layer 410, and may allow at least one of the first spacer 301 or the second spacers 302 to penetrate the first connection layer 410 through the at least one through hole 413.

Concretely, the at least one through hole 413 may include at least one of a first through hole including a planar area corresponding to the planar area of the first spacer 301 and configured to allow the first spacer 301 to penetrate the first connection layer 410, or second through holes including a planar area corresponding to the planar area of the second spacers 302 and configured to allow the second spacers 302 to penetrate the first connection layer 410.

Furthermore, at least one of the first spacer 301 or the second spacers 302 may be separated into an upper portion and a lower portion, and the first connection layer 410 may be disposed between the upper and lower portions of the at least one of the first spacer 301 or the second spacers 302 to connect both portions, and may thus be disposed to traverse the first spacer 301 and the second spacers 302.

The first connection layer 410 may be implemented as a component having conductivity, for example, low temperature co-fired ceramic, a PCB, or a metal, regardless of the kind thereof.

The first connection layer 410 having conductivity is connected to the respective elements of the power module to form electrical connection relations in the power module, and the first connection layer 410 may form a current loop depending on connection relations with the upper substrate 110, the lower substrate 120, the first semiconductor chips 201, the first spacer 301, and the second spacers 302.

Furthermore, the first connection layer 410 may form the above-described connection relations through the pattern formed on a plane.

Here, the pattern may block electrical connection among a plurality of areas to determine electrical connection relations between the elements, and may be used as an injection path of a filling material in a molding process.

Furthermore, the pattern may be formed through a combination of a plurality of separated panels which is disposed in parallel to be spaced from one another in the horizontal direction (i.e., the direction of the second axis or the third axis).

Moreover, the thickness T1 of the first connection layer 410 may be equal to or greater than the thickness T2 of the power lead 501. Because large current flows in the first connection layer 410, the first connection layer 410 has a thickness equal to or greater than the thickness of the power lead 510, in which large current also flows, and thus the proper thickness of the first connection layer 410 may be secured.

A more detailed structure of the first connection layer 410 will be described below with reference to FIG. 3.

The power lead 501 is disposed on the second metal layer 122 so that current from the outside thereof may be input to the power lead 501 or current may be output from the power lead 501. The power lead 501 may correspond to any one of a negative terminal N, a positive terminal P, and an output terminal O.

Flows shown in FIG. 1 and FIG. 2 represent the flow of current.

In the power module according to an exemplary embodiment of the present disclosure, the first connection layer 410 penetrated by the first spacer 301 and the second spacers 302 is disposed between the upper substrate 110 and the lower substrate 120, and accordingly, a current loop, in which current flows in order of the power lead 501, the second metal layer 122, the first semiconductor chips 201, the second spacers 302, the first metal layer 112, the first spacer 301, the second metal layer 122, the second semiconductor chips 202, the third spacers 303, and the first connection layer 410, as shown in FIG. 2, or in reverse order, may be formed.

Due to formation of the current loop through the first connection layer 410, current does not need to repeatedly pass through the first spacer 301 or the second spacers 302, and thus, the current loop may be simplified.

Furthermore, as shown in FIG. 1, the current loop is narrowed, and thus, a degree of current superposition is improved, almost all regions of the first connection layer 410 are included in a predetermined current superposition area O1, and the operating efficiency of the power module may be improved due to the flow of current in the predetermined current superposition area O1.

Furthermore, contrary to FIG. 2, a substrate corresponding portion 411 may not be bonded to the upper substrate 110 or the lower substrate 120, and may be bonded to the side surfaces of the third spaces 303. Even in the instant case, the current loop shown in FIG. 2 is formed. A more detailed structure of the first connection layer will be described below with reference to FIG. 3.

Figure 3:
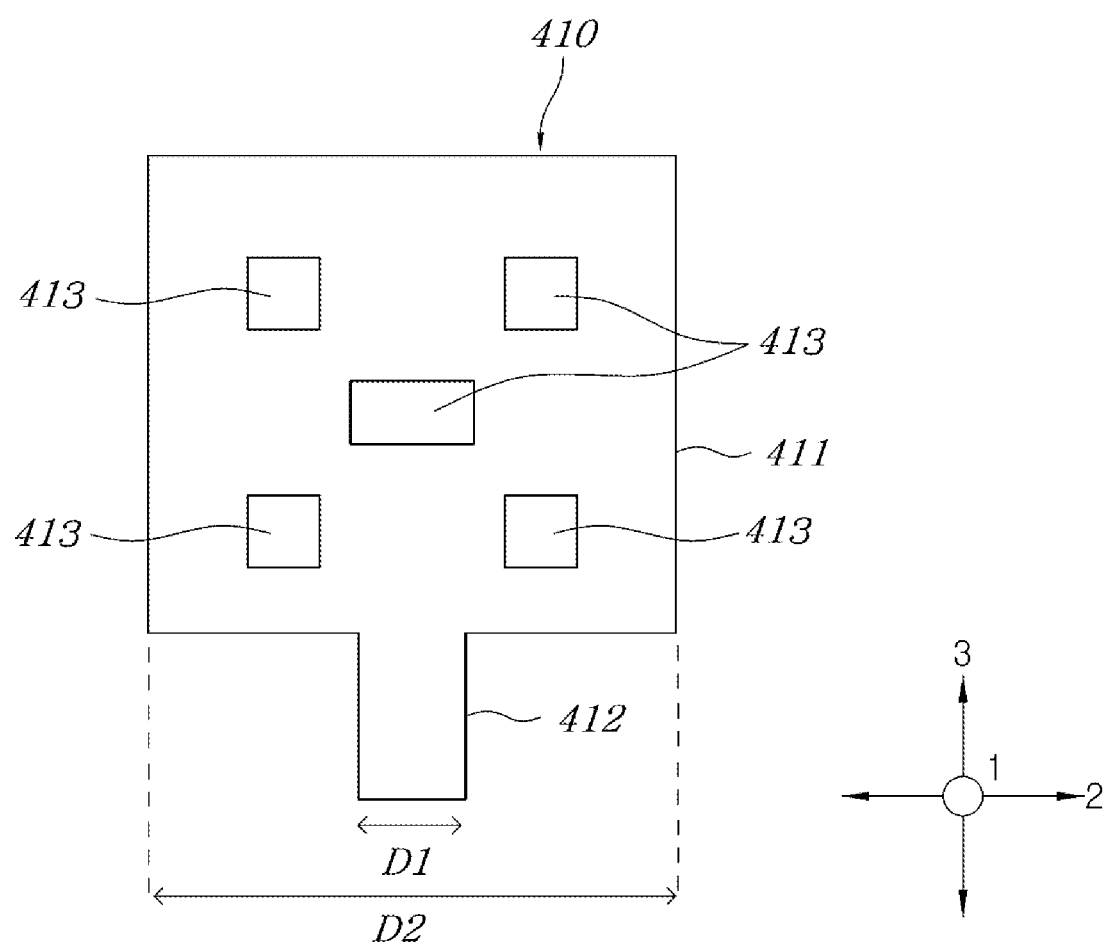
FIG. 3 is a plan view of a first connection layer according to an exemplary embodiment of the present disclosure, viewed in the direction of the first axis.

FIG. 3 is a plan view of the first connection layer according to an exemplary embodiment of the present disclosure, viewed in the direction of the first axis.

Referring to FIG. 3, the first connection layer 410 may include the substrate corresponding portion 411 and a lead corresponding portion 412.

At least a portion of the substrate corresponding portion 411 overlaps the upper substrate and the lower substrate on a plane, being configured for increasing the degree of current superposition.

The lead corresponding portion 412 has a width D1 which is less than the width D2 of the substrate corresponding portion 411 in the horizontal direction, and extends from the substrate corresponding portion 411 in the horizontal direction (i.e., in the direction of the second axis or the third axis) to protrude outside the upper substrate and the lower substrate on the plane, and current may be input to the lead corresponding portion 412 or may be output from the lead corresponding portion 412.

Hereinafter, referring to FIGS. 4 to 12, the current loop of the power module depending on the structure of the first connection layer 410 will be described.

Figure 4:
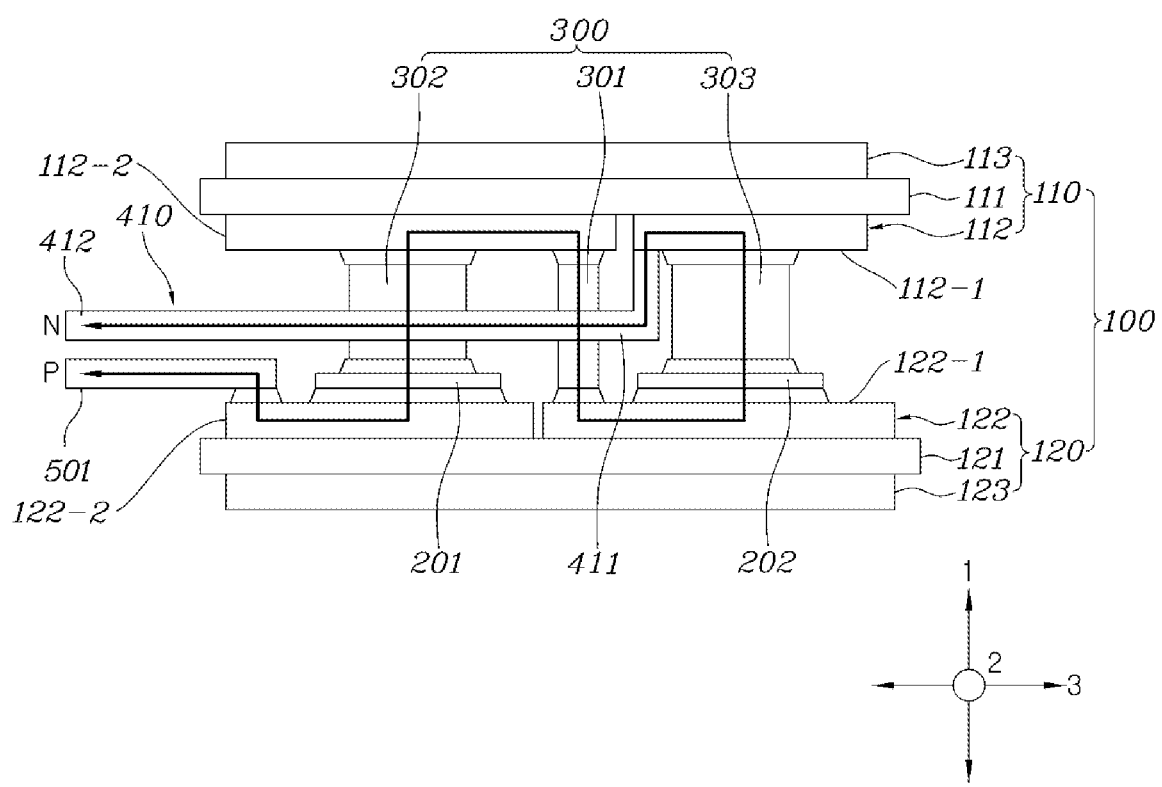
FIG. 4, FIG. 5 and FIG. 6 are side views exemplarily illustrating current loops of first connection layers including different structures according to various embodiments of the present disclosure.
Figure 5:
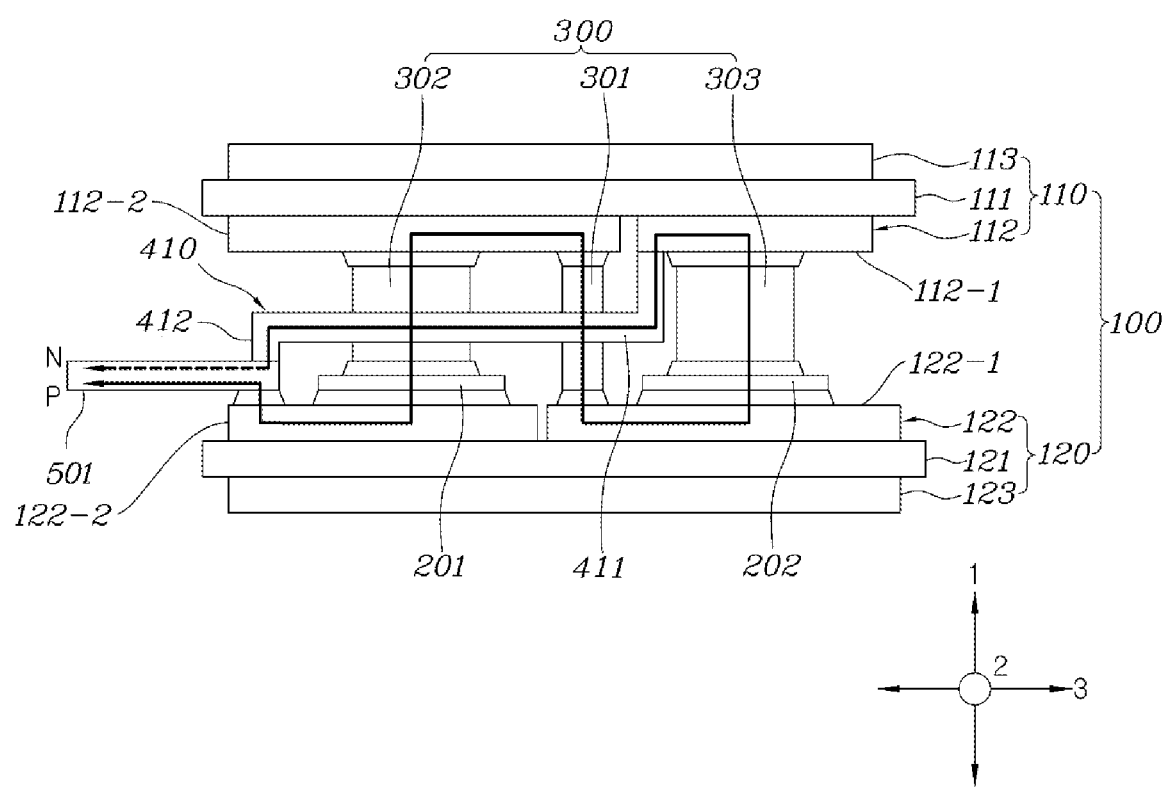
Figure 6:
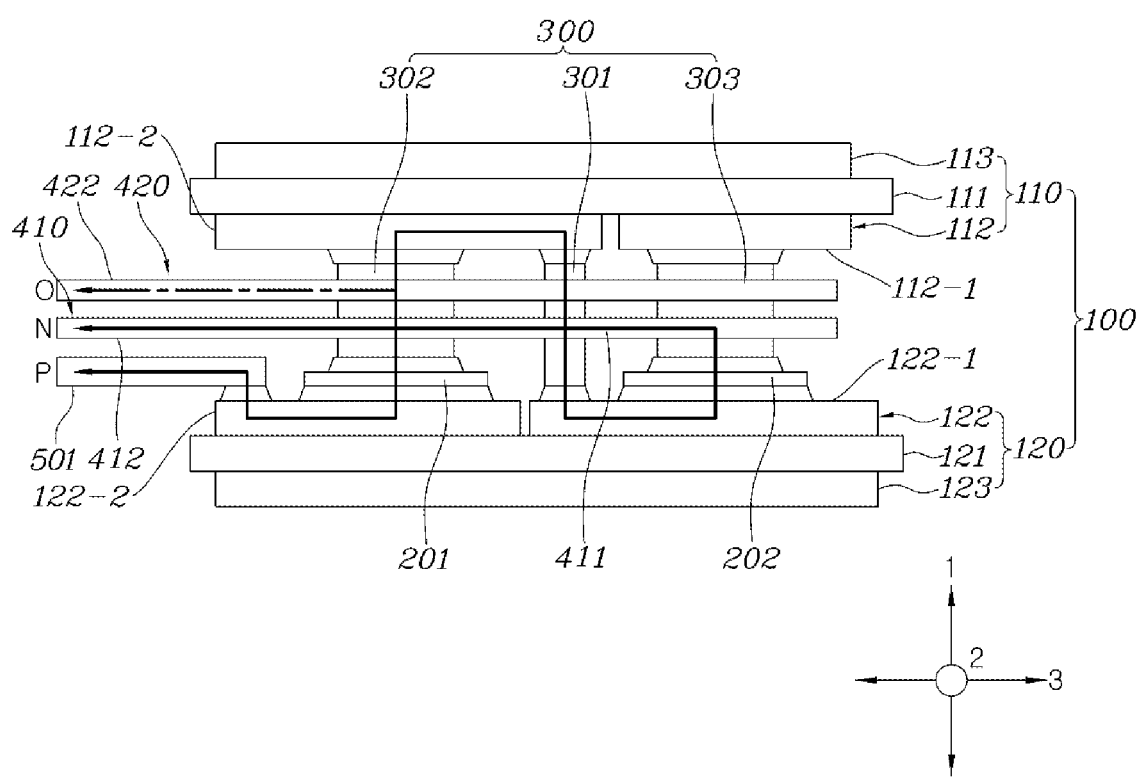

FIG. 4, FIG. 5 and FIG. 6 are side views exemplarily illustrating current loops of first connection layers having different structures according to various embodiments of the present disclosure.

First, referring to FIG. 4, it may be confirmed that the lead corresponding portion 412 corresponds to a negative terminal N, and the power lead 501 corresponds to a positive terminal P. That is, the lead corresponding portion 412 may correspond to any one of a positive terminal P, a negative terminal N and an output terminal O, and the power lead 501 may correspond to another one thereof.

The first connection layer 410 may form a current loop between the lead corresponding portion 412 and the power lead 501 using the lead corresponding portion 412 and the power lead 501 as both terminals.

Furthermore, the lead corresponding portion 412 may be disposed to be spaced upwards apart from the power lead 501 to overlap the power lead 501 on a plane. Such a disposition of the lead corresponding portion 412 and the power lead 501 may further improve the degree of current disposition.

The substrate corresponding portion 411 may be bent upwards or downwards between the first spacer 301 and the third spacers 303 to be bonded to the upper substrate 110 or the lower substrate 120.

Based on the above-described structure, a current loop, in which current flows into order of the power lead 501, the second metal layer 122, the first semiconductor chips 201, the second spacers 302, the first metal layer 112, the first spacer 301, the second metal layer 122, the second semiconductor chips 202, the third spacers 303, the first metal layer 112, and the first connection layer 410, or in reverse order, may be formed.

Next, referring to FIG. 5, it may be confirmed that the lead corresponding portion 412 may be bent downwards from the substrate corresponding portion 411 and extend outside the upper substrate 110 and the lower substrate 120 (i.e., in the direction of the third axis) so that the lead corresponding portion 412 is disposed parallel to the power lead 501 to be spaced from the power lead 501 in the horizontal direction (i.e., in the direction of the second axis) at the same height.

Based on the above-described structure, a current loop, in which current flows in order of the power lead 501, the second metal layer 122, the first semiconductor chips 201, the second spacers 302, the first metal layer 112, the first spacer 301, the second metal layer 122, the second semiconductor chips 202, the third spacers 303, the first metal layer 112, and the first connection layer 410, or in reverse order, may be formed.

Furthermore, referring to FIG. 6, the substrate corresponding portion 411 may be disposed parallel to the upper substrate 110 and the lower substrate 120, and accordingly, may improve the degree of current superposition.

Furthermore, the first connection layer 410 may allow the third spacers 303 to penetrate therethrough, to be penetrated by the third spacers 303.

Moreover, in addition to the first connection layer 410, a second connection layer 420 may be disposed between the upper substrate 110 and the lower substrate 120 to be spaced from the first connection layer 410 in the vertical direction (i.e., in the direction of the first axis).

In the instant case, a lead corresponding portion 422 of the second connection layer 420 may correspond to a remaining one of a negative terminal N, a positive terminal P, and an output terminal O, except for terminals corresponding to the lead corresponding portion 412 of the first connection layer 410 and the power lead 501.

Based on the above-described structure, a current loop, in which current flows in order of the power lead 501, the second metal layer 122, the first semiconductor chips 201, the second spacers 302, the first metal layer 112, the first spacer 301, the second metal layer 122, the second semiconductor chips 202, the third spacers 303, the first metal layer 112, and the first connection layer 410, or in reverse order, may be formed, and in the instant case, AC current may be output through the lead corresponding portion 422 of the second connection layer 420 corresponding to the output terminal O.

As described above, according to various embodiments of the present disclosure, the connection layer, which is additionally disposed between the upper substrate and the lower substrate and is penetrated by the spacers, may simplify the current loop of the power module.

Furthermore, the current loop simplified by the connection layer may improve a current superposition effect.

Furthermore, the insulation pattern and the via spacer provided to form the current loop may be reduced, and thus, the size of the power module may be reduced.

Moreover, the simplification of the current loop and the reduction in the size of the power module may improve reliability of the power module.

As is apparent from the above description, according to various embodiments of the present disclosure, a connection layer, which is additionally disposed between an upper substrate and a lower substrate and is penetrated by spacers, may simplify the current loop of a power module.

Furthermore, the current loop simplified by the connection layer may improve a current superposition effect.

Furthermore, an insulation pattern and a via spacer provided to form the current loop may be reduced, and thus, the size of the power module may be reduced.

Moreover, the simplification of the current loop and the reduction in the size of the power module may improve reliability of the power module.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A power module comprising:
   an upper substrate including a first insulating layer and a first metal layer disposed on a lower surface of the first insulating layer;
   a lower substrate disposed below the upper substrate, and including a second insulating layer and a second metal layer disposed on an upper surface of the second insulating layer to face the first metal layer;
   a first semiconductor chip disposed on the second metal layer;
   a first spacer extending in a vertical direction of the power module and electrically connecting the first metal layer to the second metal layer;
   a second spacer extending in the vertical direction and electrically connecting the first semiconductor chip to the first metal layer;
   a first connection layer having conductivity and disposed between the upper substrate and the lower substrate to traverse a middle portion of each of the first spacer and the second spacer; and
   a power lead disposed on the second metal layer.

2. The power module of claim 1, wherein at least one of the first spacer or the second spacer is disposed to penetrate the first connection layer.

3. The power module of claim 2, wherein at least one of a first through hole having a planar area corresponding to a planar area of the first spacer to allow the first spacer to penetrate the first connection layer, or a second through hole having a planar area corresponding to a planar area of the second spacer to allow the second spacer to penetrate the first connection layer is provided in the first connection layer.

4. The power module of claim 1,
   wherein at least one of the first spacer or the second spacer is separated into an upper portion and a lower portion, and
   wherein the first connection layer is disposed between the upper portion and the lower portion of the at least one of the first spacer or the second spacer to connect the upper portion and the lower portion.

5. The power module of claim 1, wherein the first connection layer forms electrical connection relations through a pattern formed on a plane.

6. The power module of claim 5, wherein the pattern is formed through a combination of a plurality of separated panels disposed abreast to be spaced from one another in a horizontal direction thereof.

7. The power module of claim 1, wherein a thickness of the first connection layer is equal to or greater than a thickness of the power lead.

8. The power module of claim 1, wherein the first connection layer includes:
   a substrate corresponding portion configured so that at least a portion thereof overlaps the upper substrate and the lower substrate on a plane; and
   a lead corresponding portion having a width less than a width of the substrate corresponding portion and to extend from the substrate corresponding portion to protrude outside the upper substrate and the lower substrate on the plane, and provided so that current is input to the lead corresponding portion or is output from the lead corresponding portion.

9. The power module of claim 8,
   wherein the lead corresponding portion corresponds to one of a positive terminal, a negative terminal, and an output terminal, and
   wherein the power lead corresponds to another one of the positive terminal, the negative terminal, and the output terminal.

10. The power module of claim 9, wherein the first connection layer forms a current loop between the lead corresponding portion and the power lead.

11. The power module of claim 9, further including a second connection layer disposed between the upper substrate and the lower substrate to be spaced from the first connection layer in the vertical direction,
   wherein the second connection layer corresponds to a remaining one of the positive terminal, the negative terminal, and the output terminal.

12. The power module of claim 8, wherein the lead corresponding portion is disposed to be spaced upwards apart from the power lead to overlap the power lead on the plane.

13. The power module of claim 8, wherein the lead corresponding portion is bent downwards from the substrate corresponding portion and extends outside the upper substrate and the lower substrate to be spaced from the power lead in a horizontal direction at a same height and disposed abreast to the power lead.

14. The power module of claim 8, wherein the substrate corresponding portion is disposed parallel to the upper substrate and the lower substrate to be spaced from the upper substrate and the lower substrate in the vertical direction.

15. The power module of claim 8, further including:
a third spacer spaced from the second spacer in a horizontal direction with the first spacer provided therebetween,
wherein the substrate corresponding portion is bent upwards or downwards between the first spacer and the third spacer, and is bonded to the upper substrate or the lower substrate.

16. The power module of claim 1, further including:
a third spacer spaced from the second spacer in a horizontal direction with the first spacer provided therebetween,
wherein the third spacer is disposed to penetrate the first connection layer.

17. The power module of claim 1, further including:
a third spacer spaced from the second spacer in a horizontal direction with the first spacer provided therebetween,
wherein the first connection layer is bonded to a side surface of the third spacer.

18. The power module of claim 1,
wherein the first metal layer includes a right first metal layer and a left first metal layer and the second metal layer includes a right second metal layer and a left second metal layer,
wherein the first spacer extends in the vertical direction of the power module and electrically connects the right second metal layer to the left first metal layer.

19. The power module of claim 18, wherein the second spacer extends in the vertical direction and electrically connects the first semiconductor chip disposed on the left second metal layer to the left first metal layer.

20. The power module of claim 18, wherein a third spacer extends in the vertical direction and electrically connects the second semiconductor chip disposed on the right second metal layer to the right first metal layer.

* * * * *